United States Patent
Hibino et al.

(10) Patent No.: US 12,306,533 B2
(45) Date of Patent: May 20, 2025

(54) OPTICAL DEVICE MANUFACTURING METHOD AND MANUFACTURING APPARATUS USING LOCAL ETCHING

(71) Applicant: NTT Electronics Corporation, Kanagawa (JP)

(72) Inventors: Yoshinori Hibino, Yokohama (JP); Mikihiro Kurosawa, Yokohama (JP); Manabu Oguma, Yokohama (JP); Masahiro Yanagisawa, Yokohama (JP); Tomoyuki Yamada, Yokohama (JP)

(73) Assignee: NTT Electronics Corporation, Kanagawa (JP)

( * ) Notice: Subject to any disclaimer, the term of this patent is extended or adjusted under 35 U.S.C. 154(b) by 282 days.

(21) Appl. No.: 17/796,958

(22) PCT Filed: Feb. 2, 2021

(86) PCT No.: PCT/JP2021/003786
§ 371 (c)(1),
(2) Date: Aug. 2, 2022

(87) PCT Pub. No.: WO2021/157578
PCT Pub. Date: Aug. 12, 2021

(65) Prior Publication Data
US 2023/0341768 A1    Oct. 26, 2023

(30) Foreign Application Priority Data
Feb. 6, 2020    (JP) .................. 2020-019168

(51) Int. Cl.
*G03F 7/00*    (2006.01)
*G02B 6/42*    (2006.01)
*G03F 7/20*    (2006.01)

(52) U.S. Cl.
CPC .......... *G03F 7/0005* (2013.01); *G02B 6/4214* (2013.01); *G03F 7/2043* (2013.01)

(58) Field of Classification Search
CPC ... G03F 7/0005; G03F 7/2043; G02B 6/4214; G02B 6/132; G02B 2006/12104; G02B 6/1228; G02B 6/136; H01L 21/3065
(Continued)

(56) References Cited

U.S. PATENT DOCUMENTS

| | | | |
|---|---|---|---|
| 5,335,243 A | 8/1994 | Kubena et al. | |
| 5,439,782 A | 8/1995 | Haemmerle et al. | |

(Continued)

FOREIGN PATENT DOCUMENTS

| | | |
|---|---|---|
| CN | 1529187 A | 9/2004 |
| CN | 101161400 A | 4/2008 |

(Continued)

OTHER PUBLICATIONS

Chinese Office Action dated Nov. 20, 2023, issued in Chinese Application No. 202180012229.5.
(Continued)

*Primary Examiner* — Duy Vu N Deo
(74) *Attorney, Agent, or Firm* — Workman Nydegger

(57) ABSTRACT

An optical device manufacturing method and an optical device manufacturing apparatus using local etching are characterized in that in a wafer process of manufacturing a waveguide type optical device including a light-propagating core and a cladding, a nozzle which locally performs etching processing is used for movement, and a slanted end surface at an arbitrary angle, an end surface having a curved shape, or a core having a varying film thickness is formed in an arbitrary position on the wafer. A slanted end surface is formed at an optical waveguide end using local etching, for example, a 45° reflective mirror, a light-condensing nonpla-
(Continued)

nar reflective mirror, or a film thickness controlled core is implemented, and high-efficiency optical connection is realized.

6 Claims, 14 Drawing Sheets

(58) Field of Classification Search
USPC .......................................................... 216/24
See application file for complete search history.

(56) References Cited

U.S. PATENT DOCUMENTS

| | | | |
|---|---|---|---|
| 5,501,822 | A | 3/1996 | Kubena et al. |
| 2008/0018841 | A1* | 1/2008 | Rho ..................... G02F 1/1337 216/14 |
| 2010/0054663 | A1 | 3/2010 | Okayama |
| 2011/0010004 | A1 | 1/2011 | Numata |
| 2016/0104601 | A1 | 4/2016 | Obara |
| 2017/0278674 | A1 | 9/2017 | Obara |
| 2020/0124865 | A1* | 4/2020 | Meyer Timmerman Thijssen ...... G02B 5/1819 |
| 2020/0141972 | A1* | 5/2020 | Kornilov ................ G01Q 70/08 |
| 2020/0249564 | A1* | 8/2020 | Budach .................. H01J 37/20 |

FOREIGN PATENT DOCUMENTS

| | | |
|---|---|---|
| CN | 101752203 A | 6/2010 |
| CN | 108303767 A | 7/2018 |
| JP | H07-207470 A | 8/1995 |
| JP | 2004-101678 A | 4/2004 |
| JP | 2010-54943 A | 3/2010 |
| JP | 2011-31388 A | 2/2011 |
| JP | 2016-81948 A | 5/2016 |
| JP | 2017-175053 A | 9/2017 |

OTHER PUBLICATIONS

Office Action issued on May 25, 2024 in corresponding Chinese Patent Application No. 202180012229.5.
International Preliminary Report on Patentability dated Jul. 28, 2022, issued in PCT Application No. PCT/JP2021/003786, filed Feb. 2, 2021.
Office Action issued on Nov. 8, 2024 in corresponding CN Patent Application No. 202180012229.5 with English Translation.

* cited by examiner (a)

(b)

(c)

(a)

(b)

(c)

(a)

(b)

OPTICAL DEVICE MANUFACTURING METHOD AND MANUFACTURING APPARATUS USING LOCAL ETCHING

TECHNICAL FIELD

The present invention relates to a method of manufacturing a waveguide type optical device (manufacturing process) and a manufacturing apparatus thereof. More specifically, the present invention relates to a manufacturing method and manufacturing apparatus of a planar lightwave circuit (PLC).

BACKGROUND ART

In the course of recent expansion of a 5G network, data center (DC), and the like, an optical communication network characterized by large capacity and low delay is becoming increasingly important as an infrastructure. Optical devices supporting the optical communication network growing in such a circumstance require a low-cost and high-density integration technique, and key techniques are connection in a vertical direction and connection between different materials.

As a conventional manufacturing process of a waveguide type optical device, there is known a manufacturing process of a PLC (planar lightwave circuit) according to a glass particle flame hydrolysis deposition (FHD) method.

The FHD method is a method of depositing $SiO_2$ particles as soot (soot) on a substrate by, for example, thermolysis of a $SiCl_4$ material gas in oxyhydrogen flame, and can manufacture a thick film relatively easily and is excellent for mass production.

FIG. 1 is a process diagram (substrate cross-sectional view) illustrating a manufacturing process of a PLC according to the conventional FHD method. Frist, in a process of (a) of FIG. 1, a glass particle layer 1-3 for a lower cladding layer and a glass particle layer 1-4 for a core layer are formed on an Si substrate 1-2 (wafer) using an FHD burner 1-1 according to the FHD method.

Next, in a process of (b) of FIG. 1, the glass particle layers are transparentized by high-temperature heat treatment in a vitrification furnace. This enables formation of a lower cladding layer 1-5 and a core layer 1-6 with high quality.

Further, in a photoresist process of (c) of FIG. 1, a mask pattern for etching of a waveguide type circuit is transferred. The transferred core pattern is processed by reactive ion etching (RIE) to form a core 1-7 of a waveguide type circuit.

After that, in a process of (d) of FIG. 1, the FHD is performed again to deposit a glass particle layer 1-8 for an upper cladding layer, transparentization is performed in a process of (e) of FIG. 1, and an upper cladding layer 1-9 is produced. A PLC type optical device is thus produced.

In the PLC type optical device, a slanted end surface may be formed on, for example, an input/output end of an optical waveguide for input/output of light or the like such that an angle between the optical waveguide end surface and the substrate surface is not equal to 90°. To form the slanted end surface in the optical waveguide, as Prior Art 1, there is a manufacturing method of slanting a wafer as shown in FIG. 2 below.

FIG. 2 is a diagram illustrating Prior Art 1 of forming a slanted end surface in an optical waveguide. In an overall perspective view of a PLC substrate wafer of (a) of FIG. 2, a plurality of PLC type optical circuits 2-2 are formed on an Si substrate 2-1, an etching portion 2-3 is a portion to form a slanted end surface in an optical waveguide and is a portion to be processed by RIE with plasma application.

As shown in (b) of FIG. 2, in slant etching processing by reactive ion etching (RIE), the PLC substrate (wafer) is kept slanted from a horizontal plane with respect to a plasma flow arriving at the entire wafer from top to bottom in a vertical direction, reactive ion etching (slant etching) proceeds in the etching portion 2-3 at the ends of the optical waveguides while an angle θ between the plasma arriving direction and the substrate surface is not equal to 90°, and a slanted end surface is formed in the optical waveguide.

The process will be described based on the cross-sectional views of the PLC substrate in (c) to (e) of FIG. 2. In the first step in (c) of FIG. 2, a PLC type optical circuit including a lower cladding layer 2-4, a core 2-5, and an upper cladding layer 2-6 is produced on the Si substrate 2-1.

As shown in (d) of FIG. 2, a photo process is applied to the PLC type optical circuit and a photoresist 2-7 is transferred, and the wafer is slanted and etched in this state, whereby a slanted end surface 2-8 can be formed at an angle θ between the substrate surface and the end surface as shown in (e) of FIG. 2.

FIG. 3 is a diagram illustrating Prior Art 2 of producing a film thickness controlled core using a concentration gradient mask. As shown in FIG. 3, in the case of forming an SSC (spot size converter) using a film thickness controlled core having a gradually decreasing core thickness, the concentration gradient mask is used in the photoresist process.

(a) of FIG. 3 is a substrate cross-sectional view of the PLC type optical circuit at the first stage where an Si substrate 3-1, a lower cladding layer 3-2, and a core layer 3-3 are formed. As shown in (b) of FIG. 3, by applying a photo processing process to the substrate using the concentration gradient mask, a photoresist 3-4 having a gradually varying film thickness can be produced. If etching processing is performed by RIE using the photoresist 3-4 as a mask, as shown in (c) of FIG. 3, a film thickness controlled core 3-5 having a film thickness gradually decreasing in the optical wavelength direction can be produced. An SSC (spot size converter) can be thus produced in the PLC type optical circuit.

SUMMARY OF INVENTION

Technical Problem

In order to improve the degree of integration in an optical device, there is a need for not only two-dimensional integration in intra-substrate surface directions but also, for example, a three-dimensional integrated structure in which a plurality of substrates are stacked and integrated also in the vertical direction (substrate thickness direction). In this case, since an optical signal formed in an optical circuit of a substrate is transferred to other upper and lower substrates, for example, a reflective mirror formed by a slanted end surface with a 45° slant from the substrate surface is advantageous because it can align an outgoing position and incoming position of light between adjacent substrates.

Although the method of forming the slanted end surface by slanting the wafer has been described as Prior Art 1 in FIG. 2, this method has had difficulty in forming a slanted end surface having an angle of slant other than an angle close to 900 because of the impossibility of slanting the wafer at a large angle due to the limitations of the arrangement and shape of a plasma electrode in an etching apparatus. That is, since it has been impossible to reduce the angle of slant θ of the slanted end surface largely below 90°, it has been difficult to form a 45° mirror and control minutely the direction of slant of the slanted surface.

In a slanted end surface having an angle of slant θ largely different from 45°, since an outgoing position and incoming position of light are shifted in a horizontal direction parallel to the substrate surface, it is difficult to align the positions and make optical connection in the vertical connection. Accordingly, there has been difficulty in effective implementation of coupling between optical devices in the vertical direction.

Even in the case of optical coupling with a PD (photodiode, photodetector) having a relatively large light-receiving area and relatively easy to be optically connected, there has been a need for a complicated structure such as oblique setting of the PD. In addition, in the case of connection to a PD via a slanted end surface having θ greater or less than 45°, there has been a disadvantage that a distance necessary for optical connection becomes long and a connection loss increases.

Furthermore, in the method of forming the slanted end surface by slanting the wafer, the formed end surface is a plane and a light-condensing structure cannot be produced. Since light is diffused if a distance for optical connection becomes long, a connection loss has increased.

Moreover, in order to improve the degree of integration while maximizing the utilization of performance of an optical device, it is effective to combine different kinds of waveguides formed of optical materials having different refractive indexes and make optical connection between the different kinds of waveguides. However, since the different kinds of waveguides formed of optical materials having different refractive indexes are also different in light expansion diameter, it is necessary to convert the light expansion size (spot size). Thus, there has been a need for a high-efficiency spot size converter (SSC).

To implement the high-efficiency SSC, it is effective to configure a film thickness controlled core to have a so-called tapered thickness variation, in which the core thickness of the SSC waveguide portion continuously and gradually decreases. However, in the method of forming the film thickness controlled core according to Prior Art 2 shown in FIG. 3, since the photoresist process is performed in an unstable light exposure area in addition to the expensiveness of the concentration gradient mask used for core formation, there has been a disadvantage of poor stability of the process. Accordingly, stable production of a high-efficiency SSC has not been achieved by this method.

Solution to Problem

The present invention aims to form an end surface at an optical waveguide end using local etching in a wafer process of manufacturing a waveguide type optical device, implement, for example, a 45° reflective mirror or a light-condensing nonplanar reflective mirror, and realize high-efficiency optical connection in a vertical direction of a substrate. The present invention also aims to form a film thickness controlled core having a core thickness decreasing in a tapered manner, produce a high-efficiency SSC, and enable optical connection between different kinds of waveguides.

To solve the above problem, for example, the present invention can have the following configurations of embodiments.

Configuration 1

An optical device manufacturing method using local etching, which includes a wafer process of manufacturing a waveguide type optical device composed of a light-propagating core and a cladding, the method comprising:
  forming a slanted end surface at an arbitrary angle in an arbitrary position on a wafer by use of a nozzle which locally performs etching processing.

Configuration 2

The optical device manufacturing method according to Configuration 1 using local etching, which includes the wafer process of manufacturing a waveguide type optical device composed of a light-propagating core and a cladding, the method comprising:
  forming a photoresist on a manufactured wafer; and
  after photoresist formation, forming a slanted end surface at an arbitrary angle by controlling a relationship between a moving speed and relative positions of the wafer and a nozzle which locally performs etching processing.

Configuration 3

The optical device manufacturing method according to Configuration 1 using local etching, which includes the wafer process of manufacturing a waveguide type optical device composed of a light-propagating core and a cladding, the method comprising:
  forming a photoresist on a manufactured wafer; and
  after photoresist formation, forming an end surface having a light-condensing shape on a wafer by controlling a relationship between a moving speed and relative positions of the wafer and a nozzle which locally performs etching processing.

Configuration 4

The optical device manufacturing method according to Configuration 1 using local etching, which includes the wafer process of manufacturing a waveguide type optical device composed of a light-propagating core and a cladding, the method comprising:
  forming a spot size converter (SSC) circuit by decreasing a thickness of a core in a tapered manner in an arbitrary position using a nozzle which locally performs etching processing.

Configuration 5

The optical device manufacturing method according to any one of Configurations 1 to 4 using local etching, wherein the waveguide type optical device is an $SiO_2$-based planar lightwave circuit (PLC) type optical device, an optical semiconductor (InP, GaAs, Si)-based optical device, or a $LiNbO_3$-based optical device.

Configuration 6

An optical device manufacturing apparatus using local etching, the optical device manufacturing apparatus which fabricates a wafer for a waveguide type optical device composed of a light-propagating core and a cladding, comprising:
  a nozzle which locally performs etching processing;
  a mechanism which makes the nozzle movable in a vertical direction: and
  a mechanism which can move a wafer in a horizontal direction,
  wherein the optical device manufacturing apparatus is capable of adjusting a relative positional relationship in a vertical direction and a horizontal direction for the nozzle and controlling an etching area and a shape.

Configuration 7

The optical device manufacturing apparatus using local etching according to Configuration 6, wherein a shape of a nozzle opening has a rectangular portion such that multiple optical waveguides can be processed at once.
Configuration 8

The optical device manufacturing apparatus using local etching according to Configuration 6, wherein the shape of a nozzle opening has multiple nozzle openings such that multiple optical waveguides can be processed individually, and that an interval between the multiple nozzle openings is variable.

Advantageous Effects of Invention

The above configurations make it possible to form a slanted end surface at an arbitrary angle, enable high-efficiency optical coupling in the vertical direction of the substrate, and realize high-density optical integration.

Furthermore, a light-condensing mirror can be easily formed and coupling efficiency can be improved.

Moreover, the use of a local etching process enables control of the thickness of a core, production of a high-efficiency SSC, and reduction in connection loss between different kinds of waveguides.

BRIEF DESCRIPTION OF DRAWINGS

A process diagram illustrating a PLC manufacturing process according to a conventional FHD method.

An illustration of Prior Art 1 of forming a slanted end surface in an optical waveguide.

An illustration of Prior Art 2 of producing a film thickness controlled core using a concentration gradient mask.

A diagram illustrating a manufacturing process of forming a slanted end surface of Example 1 of the present invention.

A cross-sectional view illustrating the details of the manufacturing process of Example 1.

A diagram showing the configuration of each part of a PLC produced by the manufacturing process of Example 1.

A cross-sectional view of a mounting structure in which the PLC of Example 1 and a PD are coupled.

A diagram illustrating a manufacturing process of forming a light-condensing end surface of Example 2.

A graph showing a relationship between time and a moving distance of an Si substrate in Example 2.

A cross-sectional view illustrating another manufacturing process of Example 2.

A cross-sectional view illustrating yet another manufacturing process of Example 2.

A mounting structure diagram in which a PLC of Example 2 and an Si photonics circuit are coupled.

A process diagram illustrating an SSC manufacturing process of Example 3.

A configuration diagram of a manufacturing apparatus of Example 4.

DESCRIPTION OF EMBODIMENTS

Examples of the present invention will be hereinafter described in detail with reference to the drawings.

Example 1

In Example 1 of the present invention, in order to solve the aforementioned problem, a slanted end surface was formed by local etching in a PLC type optical device and optical coupling with a PD was realized with a small loss. A wafer process (manufacturing method) and mounting form of Example 1 will be hereinafter described with reference to FIG. 4 to FIG. 7.

Figure 1:
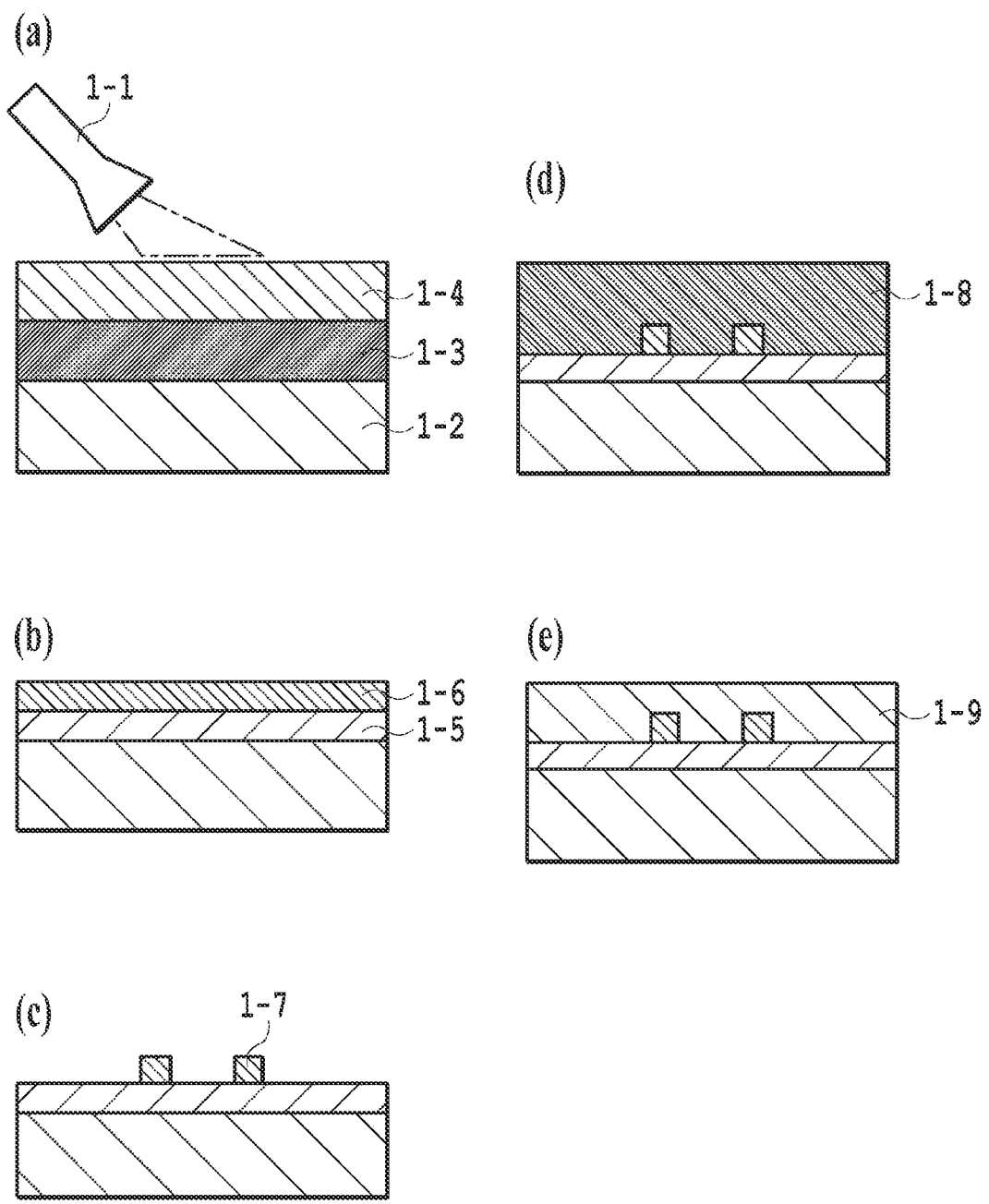
Figure 2:
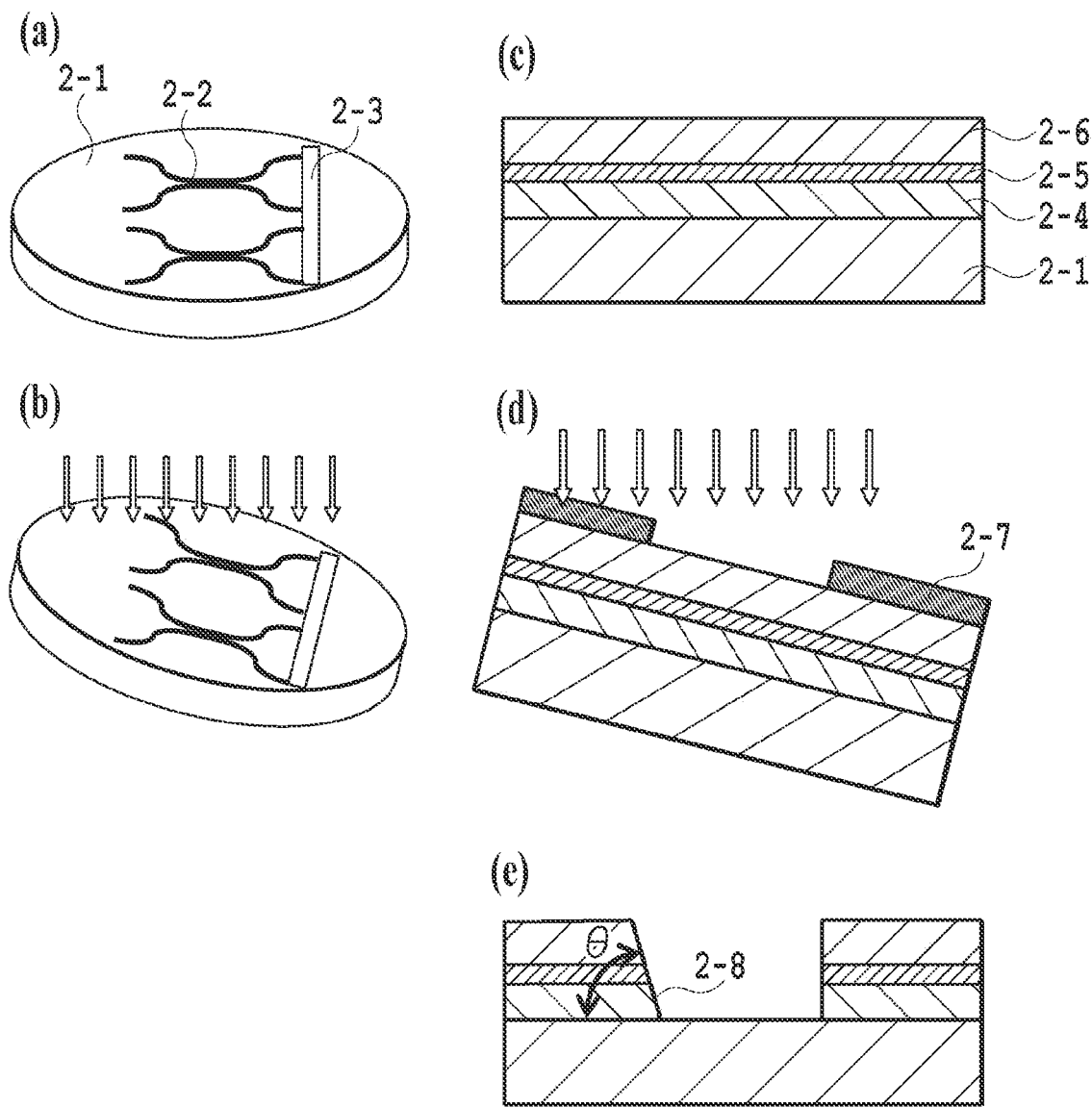
Figure 3:
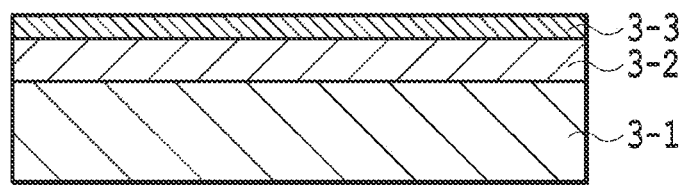
Figure 3:
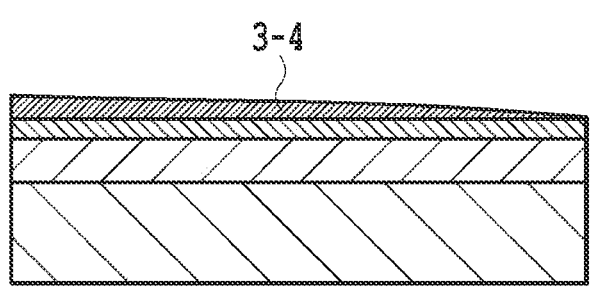
Figure 3:
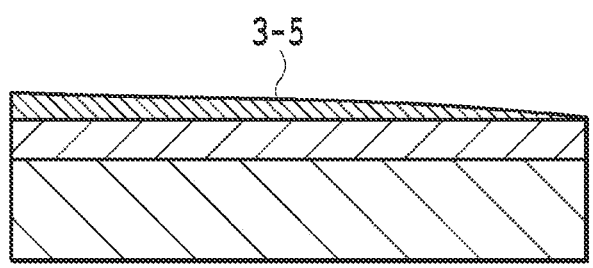
Figure 4:
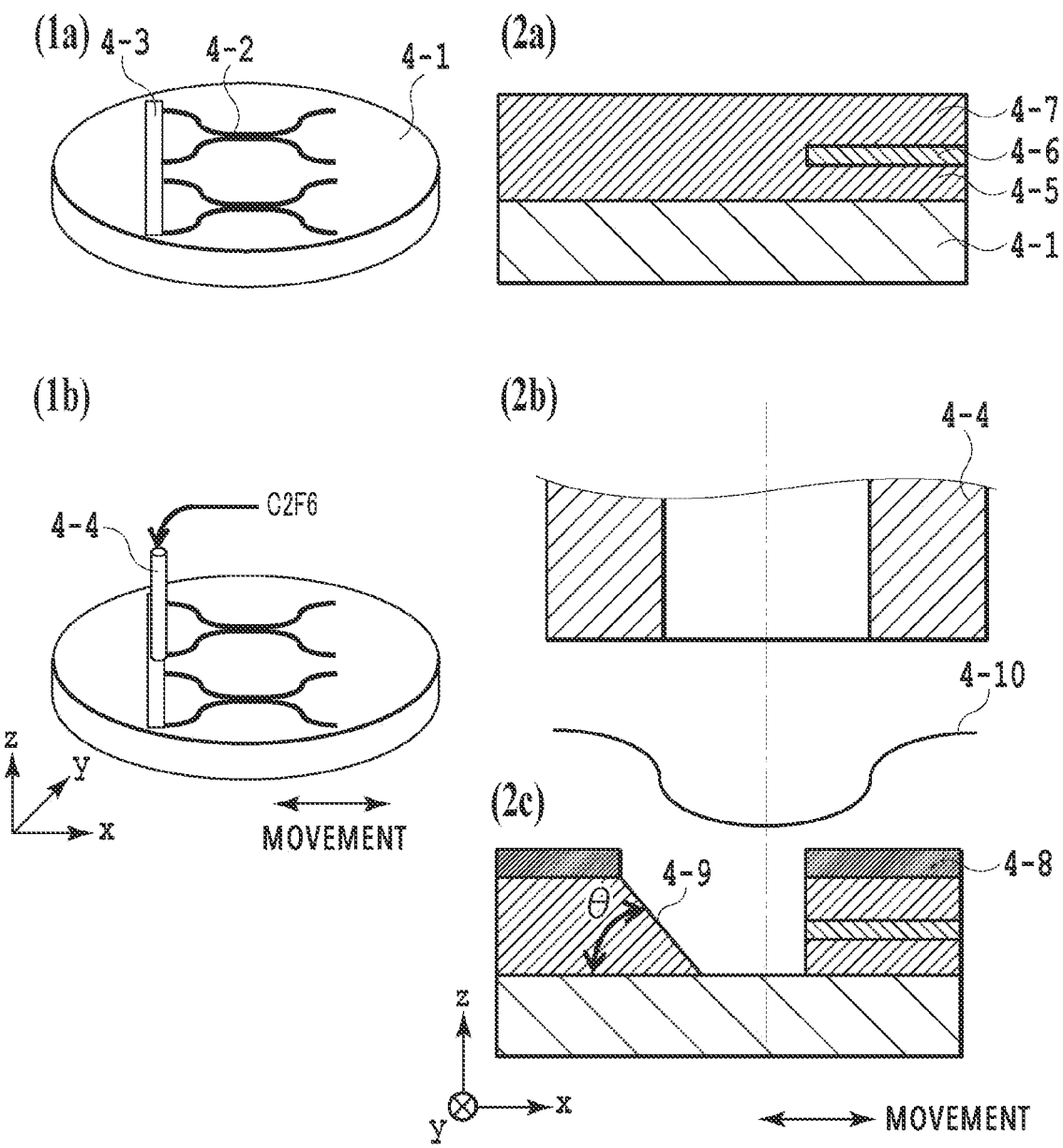

FIG. 4 is a diagram illustrating a manufacturing process of forming a slanted end surface of Example 1 of the present invention. (1a) of FIG. 4 is a wafer perspective view, a plurality of optical circuits 4-2 were formed on a 6-inch Si substrate 4-1 (1 mm-thick wafer), and an etching portion 4-3 forming a slanted end surface at the ends of optical waveguides of the optical circuits was formed by a photo process on the Si substrate and processed with a small-diameter local etching nozzle 4-4.

As shown in a wafer perspective view of (1b) of FIG. 4, in order to perform local etching, plasma was induced at the tip of the small-diameter nozzle 4-4 in a vacuum and reactive ion etching (RIE) was performed. For etching of glass, $C_2F_6$ was used as a reactive etching gas to be supplied to the local etching nozzle 4-4 and a pressure was 5 Pa.

(2a) and (2c) of FIG. 4 show enlarged substrate cross-sectional structures of the etching portion 4-3 before and after the processing and (2b) of FIG. 4 shows a cross-sectional view of the nozzle tip of the local etching nozzle 4-4 along a central axis (alternate long and short dashed line) of a nozzle opening.

Although the shape of the open side of the local etching nozzle 4-4 in (2b) of FIG. 4 is shown as a circular shape having an interior diameter of about 10 to 50 m for example, it can be any shape or size depending on an area to be subjected to local etching and is not limited to this.

As shown in (2b) of FIG. 4, the nozzle 4-4 was kept about 3 mm in the vertical direction away from the substrate surface of the substrate 4-1. As shown in (2c) of FIG. 4, reactive ion etching was performed by emitting a local etching beam 4-10 having an intensity distribution as illustrated from the nozzle while moving the substrate 4-1 in a horizontal direction (a light propagation direction of the optical waveguide is an X axis).

Incidentally, although the local etching beam 4-10 is expressed as a beam, it corresponds to an etching intensity distribution. The etching gas is sucked or ejected from the nozzle 4-4, whereby plasma including reactive ions is distributed around the central axis of the nozzle opening roughly at Gaussian intensity as exemplified by the beam 4-10 at the tip of the nozzle and etching is performed along the Gaussian distribution.

As shown in (2a) of FIG. 4, a lower cladding layer 4-5 (15 m-thick), a core 4-6 (5 m-thick to a required portion), and an upper cladding layer 4-7 (20 m-thick) were formed on the Si substrate 4-1, and the core was not formed in the etching portion 4-3 before processing.

A photo process was applied to this and a photoresist 4-8 was formed in a desired pattern in the uppermost layer as shown in (2c) of FIG. 4. After that, with the local etching nozzle 4-4 fixed, the substrate 4-1 was moved in the horizontal direction (X axis direction) and local etching processing was performed by reactive ion etching to thereby form a slanted end surface 4-9.

As will be described later, the shape of the slanted end surface may be arbitrarily molded in a moving direction and speed of the Si substrate and may be a plane or a light-condensing curved surface, and does not have to be formed on the entire end surface. That is, it is only required that a reflective surface which is a plane or a light-condensing curved surface be formed in an area which reflects outgoing light from the core end surface of the optical waveguide facing the slanted end surface.

The Si substrate may be processed while being moved not only in the X axis direction within the substrate surface but also in the Y axis direction and further in the vertical direction (Z axis direction) from the substrate surface, and the nozzle may be moved instead of the Si substrate.

Figure 5:
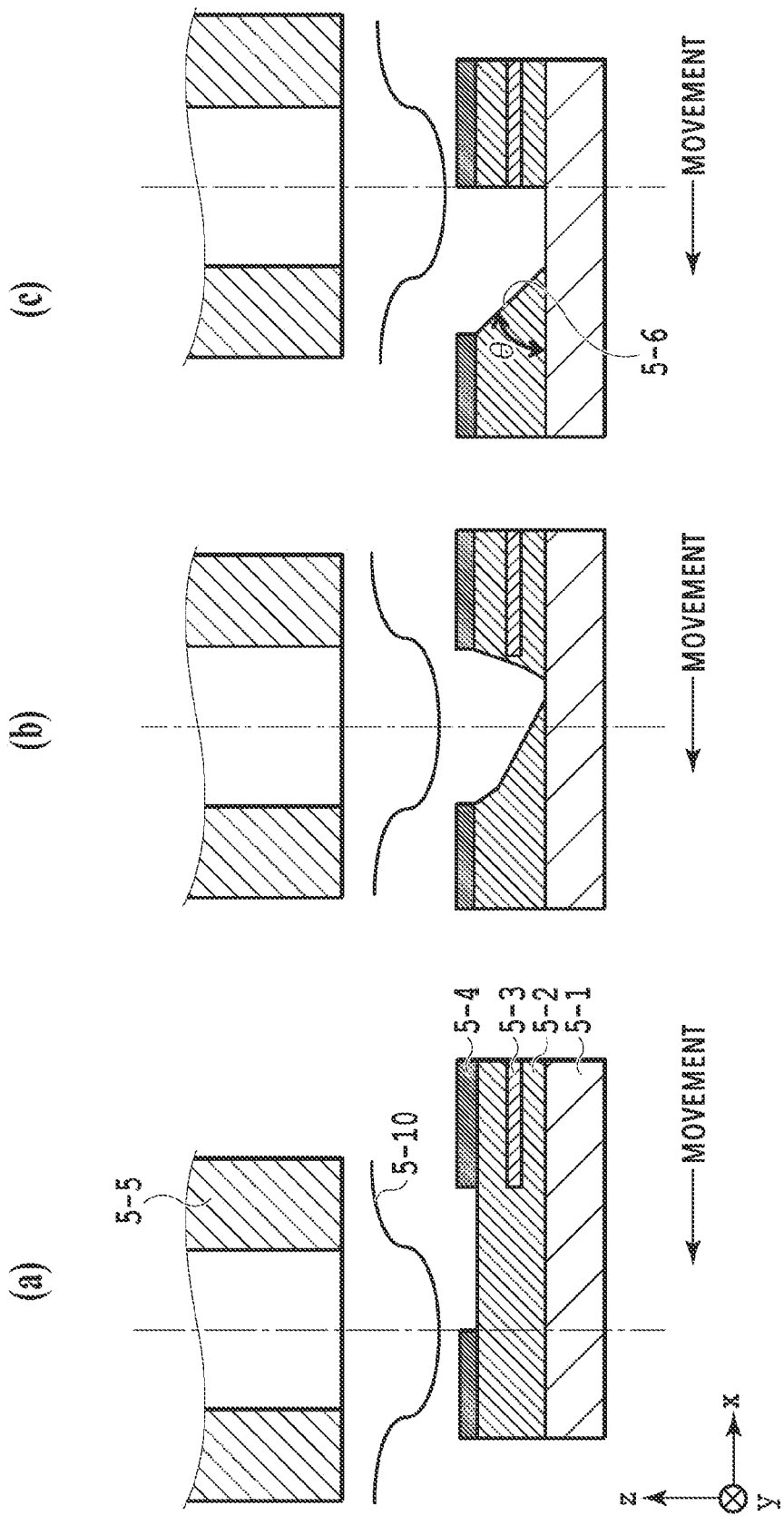

FIG. 5 is a cross-sectional view illustrating the details of the manufacturing process of Example 1 of the present invention. (a) to (c) of FIG. 5 show more details of the formation process of the slanted end surface shown in (2b) and (2c) of FIG. 4.

As shown in (a) of FIG. 5, prior to the start of etching, a photo process is applied to the PLC type optical circuit including the Si substrate 5-1, the cladding layer 5-2, and the core 5-3, and the photoresist 5-4 is formed in the uppermost layer. Next, the substrate surface is irradiated with an etching beam 5-10 from the local etching nozzle 5-5 and glass processing is performed by local etching.

As shown in (b) of FIG. 5, in the midstream of local etching, a distribution of plasma intensity of local etching (local etching beam intensity distribution 5-10) in a nozzle opening portion is, for example, a Gaussian distribution which is rotationally symmetric about the central axis of the nozzle opening (shown by the alternate long and short dashed line) because the nozzle opening portion has a circular shape. Accordingly, also in a cross section (X-Z plane in FIG. 5) in the Si substrate moving direction, the beam intensity has a Gaussian distribution and the amount of etching processing by RIE also has a shape substantially depending on that beam intensity distribution. Although it depends on the amount of supply of the etching gas and the speed of nozzle movement, the amount of etching processing can be said to be finally determined by the cumulative amount of beam exposure at each point of the substrate surface.

Through the use of the above feature, the Si substrate 5-1 is finely adjusted and moved in the horizontal direction, whereby the slanted end surface having θ of 45° can be finally formed as shown in (c) of FIG. 5. A slanted end surface at a desired angle can be formed by adjusting the pressure of the reactive etching gas and the moving speed of the Si substrate depending on the angle of the slanted end surface to be formed. This time, the Si substrate was moved at a speed of 0.5 mm/h in a direction parallel to the waveguide and a slanted end surface having θ of 45° was formed. Specifically, the substrate was moved and etched such that the nozzle opening center moved between both ends of the opening portion in which the photoresist 5-4 was not formed, that is, from an opening end on the side on which the core 5-3 was not formed to an opening end in which the core 5-3 was formed. Incidentally, a portion covered with the photoresist 5-4 will never be etched.

Figure 6:
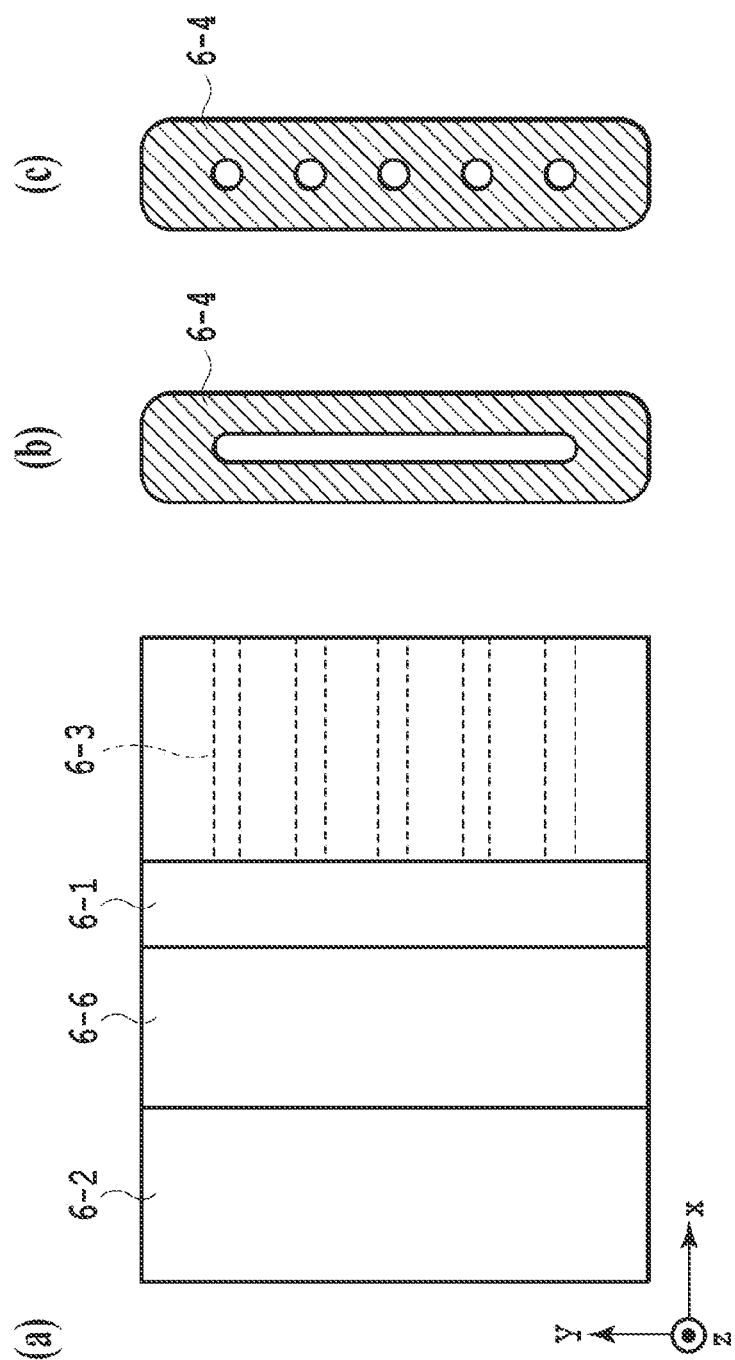

FIG. 6 is a diagram showing the configuration of each part of the PLC produced by the manufacturing process of Example 1 of the present invention. (a) of FIG. 6 is a substrate top view (X-Y plane) subsequent to photoresist removal at the optical waveguide end of the PLC type optical device having the plurality of optical waveguides after the slanted end surface is processed in the above manner. On the substrate after the slanted end surface processing, an Si substrate 6-1, a cladding layer 6-2, and a slanted end surface 6-6 are shown when viewed from the substrate top surface and the positions of a plurality of cores 6-3 are shown by dashed lines below the upper cladding.

Although the slanted end surface 6-6 is configured as a single reflective mirror which extends in the Y axis direction and reflects a plurality of outgoing light beams from the optical cores of the plurality of optical waveguides, it may also be formed as a plurality of slanted end surfaces which individually reflect outgoing light beams from the respective optical cores.

For example, outgoing light from the optical waveguide core 6-3 to the left direction (X axis negative direction) in the drawing passes above the Si substrate 6-1, is reflected on the slanted end surface 6-6, and if an angle θ between the slanted end surface 6-6 and the substrate surface is 45°, is reflected in a direction orthogonal to the substrate surface (Z axis positive direction). The optical coupling structure may also be made such that incoming light from the opposite direction orthogonal to the substrate surface (Z axis negative direction) is reflected on the slanted end surface 6-6 and enters the optical waveguide core 6-3.

In Example 1, in order to etch the cores of multiple optical waveguides at once, it is assumed that the shape of the nozzle opening of the local etching nozzle 6-4 has a vertical rectangular opening covering all the cores as shown by the nozzle opening shape in (b) of FIG. 6. As shown in (c) of FIG. 6, a plurality of circular opening nozzles may be arranged in a single vertical array to form multiple nozzles. In line with the intervals between the multiple optical waveguides, the intervals between the multiple nozzles also do not have to be uniform and may be variable.

Mounting Structure in which the PLC of Example 1 and a PD are Coupled

Figure 7:
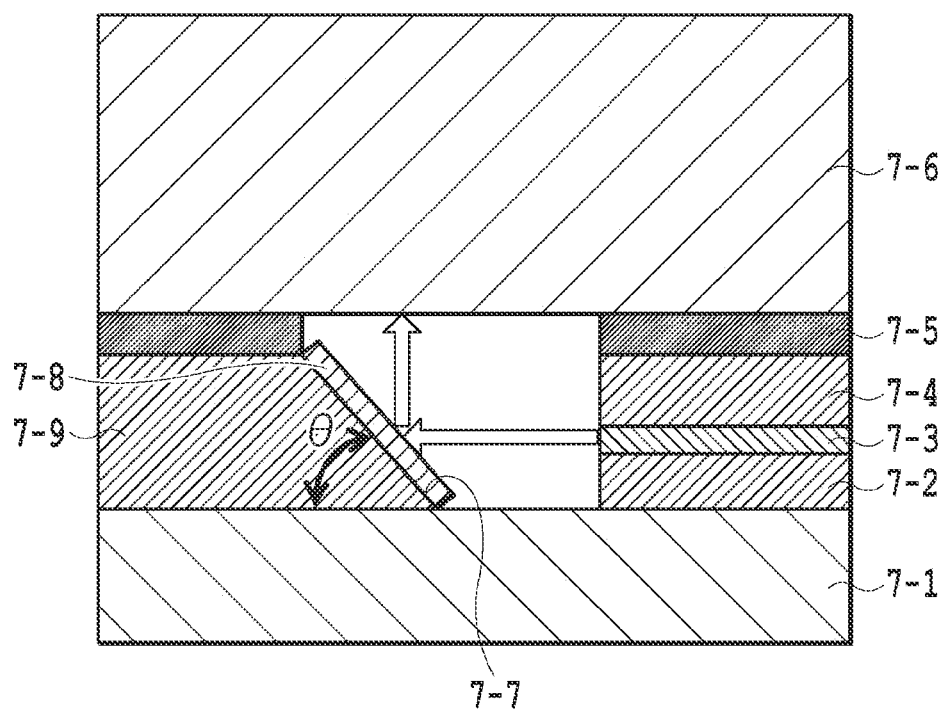

FIG. 7 is a cross-sectional view of a mounting structure in which the PLC of Example 1 of the present invention and a PD are coupled. There is shown a substrate cross-sectional structure of an optical coupling portion in the mounting structure in which the PLC type optical device with the slanted end surface formed in Example 1 and a PD (photodetector, light-receiving element) 7-6 are coupled. The optical waveguide side of the PLC on the right of FIG. 7 has a laminated structure of an Si substrate 7-1, a lower cladding layer 7-2, a core 7-3, and an upper cladding layer 7-4, and is mechanically joined to a PD 7-6 above via a solder layer 7-5.

A slanted end surface 7-7 of the PLC is formed on an end surface of the cladding layer 7-9 corresponding to an extension of the core 7-3 on the left of FIG. 7, and a metal (Au) reflective surface 7-8 is formed on the end surface 7-7 to configure a reflective mirror, which reflects outgoing light from the end surface of the optical waveguide core 7-3 of the PLC toward the PD 7-6 at high reflectivity. The angle of reflection of the slanted end surface 7-7 is formed such that the reflected light enters a light-receiving surface of the PD 7-6. The optical coupling can also be made in the opposite direction of entering the optical waveguide core 7-3 by replacing the PD 7-6 with a surface emitting laser or the like.

In the manufacturing method of Example 1, a metal process was performed after the formation of the slanted end surface, the metal (Au) film 7-8 forming a reflective mirror was formed, and then the solder layer 7-5 to be equipped with the PD 7-6 was formed. The PD 7-6 was fixed and connected to the top of the PLC type optical device by the solder layer 7-5 and optical coupling efficiency was measured. As a result, the coupling efficiency of 95% was obtained and the effectiveness of the present invention was confirmed.

Example 2

FIG. 8 to FIG. 12 show a manufacturing method of forming a light-condensing nonplanar end surface by local etching at an end of an optical waveguide in a PLC type optical device of Example 2. As a mounting structure of Example 2, there will be shown an example in which optical coupling in the vertical direction was realized with a small loss between an Si photonics-based optical device and the PLC type optical device.

As the light-condensing nonplanar end surface shape, in the case of a mirror, it is only necessary to condense incoming light into a single point by reflection, and examples thereof include a spherical mirror shape such as a concave mirror and an aspheric mirror shape formed by a paraboloid, hyperboloid, ellipsoid, or the like. In the case of an optical device having a plurality of multiple optical cores as shown in the example of FIG. 6 of Example 1, a nonplanar mirror may be individually provided for each optical core. Alternatively, it may be a cylindrical nonplanar mirror having such a shape that, for example, a surface of a cylinder is divided into about 4 to 8 equal parts along its axis and the cross-sectional shape of the same X-Z plane continues in a direction in which the optical cores are arranged (Y axis direction).

Figure 8:
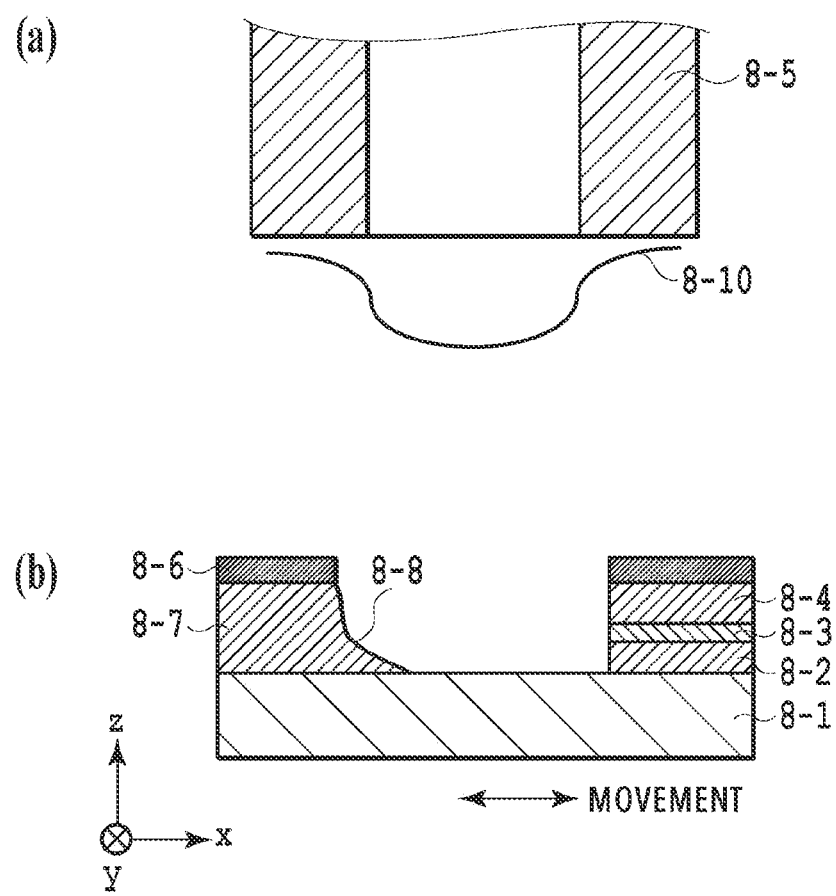

FIG. 8 is a diagram illustrating a manufacturing process of the PLC type optical device of Example 2 of the present invention. (b) of FIG. 8 is a substrate cross-sectional view of a cross section (X-Z plane) including an optical core illustrating a method of forming a light-condensing nonplanar end surface structure for a single optical core produced in Example 2.

In the substrate cross-sectional view of (b) of FIG. 8, an Si substrate 8-1, a lower cladding layer 8-2, a core 8-3, and an upper cladding layer 8-4 are in the same laminated structure as that of Example 1 to form the PLC type optical circuit. A photo process was similarly applied to the PLC to form a photoresist 8-6 in the uppermost layer.

After that, a local etching nozzle 8-5 of (a) of FIG. 8 applied a beam 8-10 for reactive ion etching and local etching processing was performed. This formed a light-condensing nonplanar end surface 8-8 in an end surface of the cladding layer 8-7 corresponding to an extension of the core 8-3. At that time, in order to form a light-condensing nonplanar end surface shape, the moving speed of the Si substrate 8-1 in the X direction was controlled by a control program as described below with reference to FIG. 9.

Figure 9:
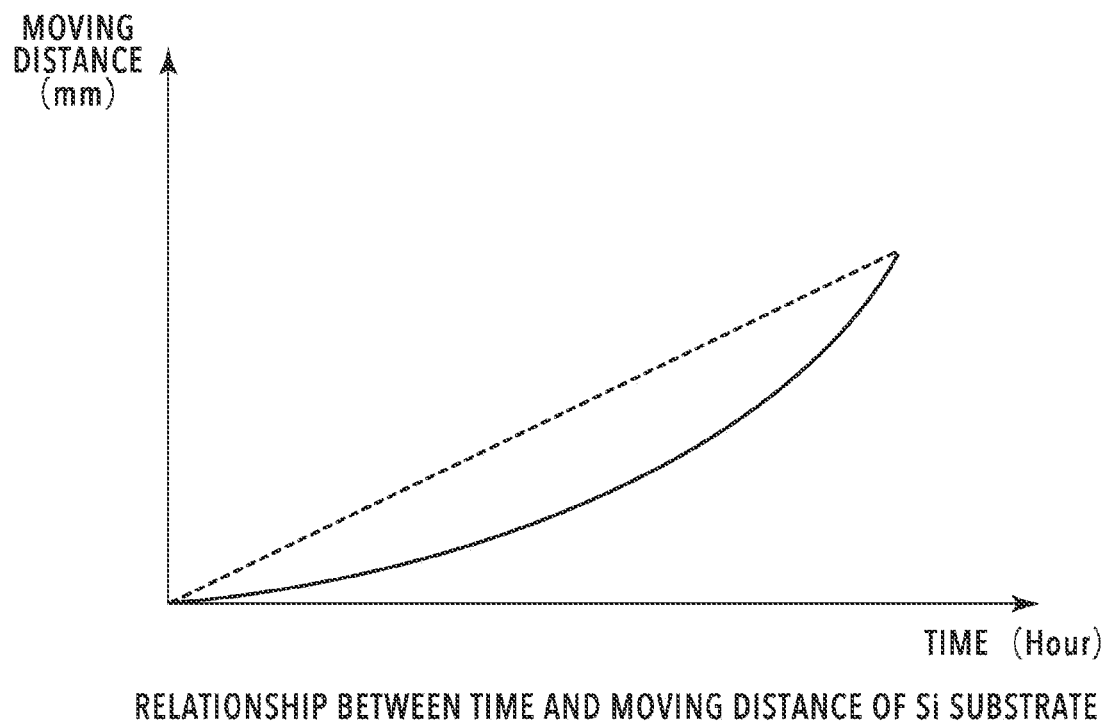

FIG. 9 is a graph showing a relationship between time and a moving distance (X axis direction) of the Si substrate as an example of moving speed control. In FIG. 9, the gradient of the graph is the moving speed of the Si substrate. The moving distance in the vertical axis of FIG. 9 indicates a distance of movement of the center of the local etching nozzle 8-5 from one end to the other end of the etching processing portion. As shown by a solid line in FIG. 9, if the moving speed of the Si substrate 8-1 is controlled such that it increases with time, the amount of etching gradually decreases on the cladding layer 8-7 side of FIG. 8, the thickness of the cladding layer 8-7 remaining unetched gradually increases to form a nonplanar shape, and a light-condensing curved shape can be formed. In FIG. 9, the dashed line is a straight line of a constant speed shown for reference.

Further, if the Si substrate or nozzle is moved and controlled in the Y axis direction or the vertical direction (Z axis direction) of the nozzle, for example, it is also possible to form an end surface having a three-dimensional concave mirror shape.

Figure 10:
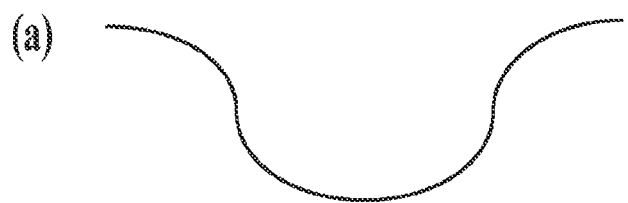
Figure 10:
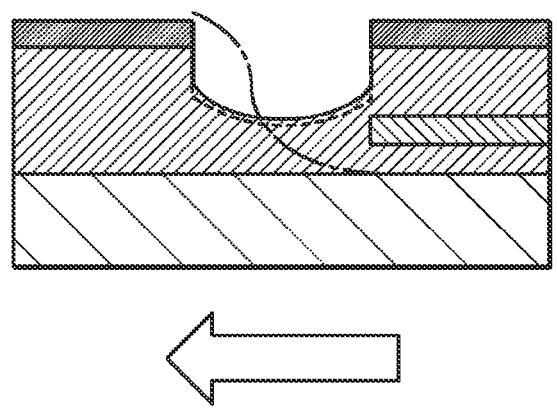
Figure 10:
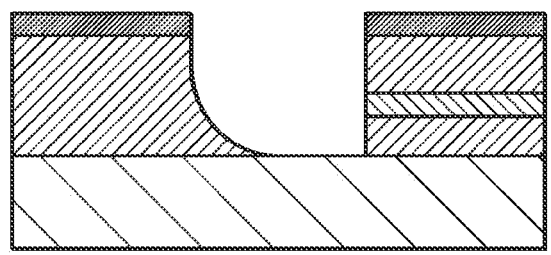
Figure 10:
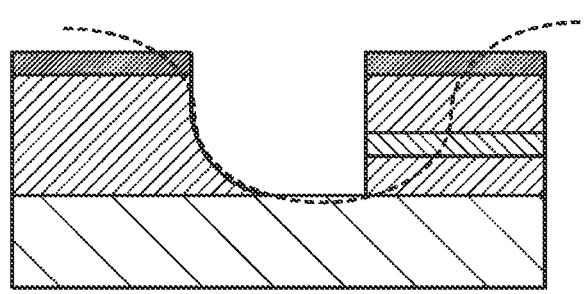

FIG. 10 is a cross-sectional view illustrating another manufacturing process of a PLC type optical device of Example 2 of the present invention. As another example of a light-condensing nonplanar end surface, there is shown the case of producing a light-condensing curved surface having a parabolic shape. As shown in (a) of FIG. 10, in a position where the center of the local etching nozzle corresponds to the center of the etching processing portion, if the Si substrate is irradiated with an etching beam for a given period without being moved, the Si substrate is etched roughly in the shape of a plasma intensity distribution (e.g., a Gaussian distribution) of the irradiated beam. If the etching deepest portion reaches the optical waveguide area, the Si substrate is moved such that the center of the etching beam is located above the optical waveguide outgoing end and the etching is finished at the time when the slant of the end surface facing the optical waveguide reaches a predetermined angle (e.g., 45°).

In the above process, the parabolic end surface can be formed as shown in (b) of FIG. 10. Since the optical field of the outgoing light from the optical waveguide is enlarged due to a difference in refractive index, the light-condensing curved surface is smaller in optical loss and more advantageous than the planar end surface. It becomes more effective for a PD which has a small light-receiving area and is capable of high-speed operation.

Further, as shown in (c) of FIG. 10, if a part of the shape of the plasma intensity distribution has a curve corresponding to a desired curved surface shape, a desired curved surface shape can also be produced in a single etching process without moving the Si substrate.

As described above, although a curved surface having a predetermined arbitrary cross-sectional shape can be produced by continuously moving the Si substrate, a substantially planar or light-condensing curved surface can be formed even if the Si substrate is not moved or is moved discontinuously multiple times (a single time in the above example of the parabolic shape). In this case, the moving speed control graph of FIG. 9 becomes a stair-like (stepped) line graph. By thus controlling the relationship between the moving speed and the relative positions of the nozzle and wafer, not only a slanted end surface at an arbitrary angle but also a light-condensing end surface of an arbitrary shape can be formed on the wafer.

Figure 11:
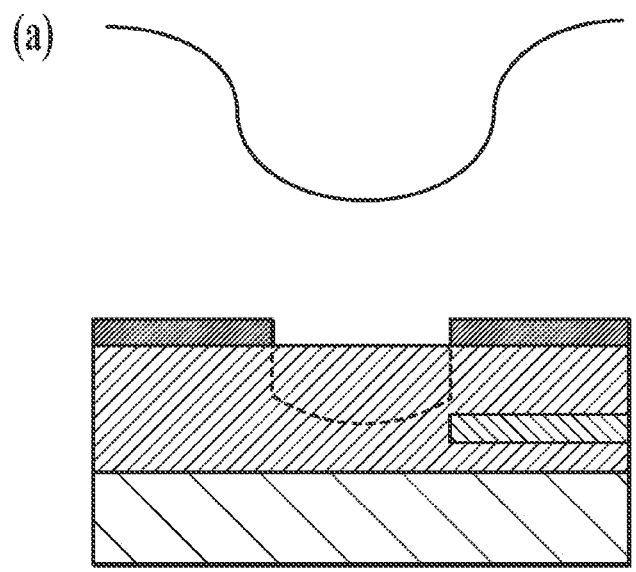
Figure 11:
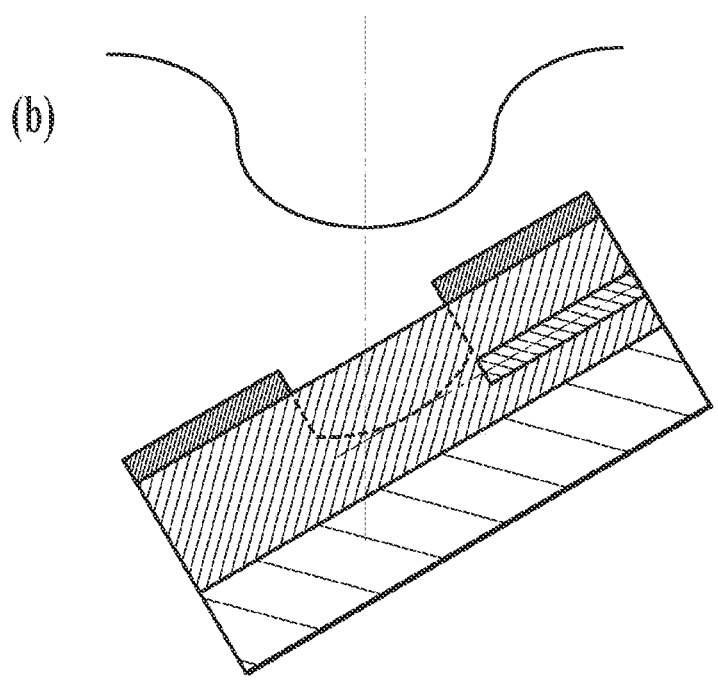

FIG. 11 is a cross-sectional view illustrating yet another manufacturing process of the PLC type optical device of Example 2 of the present invention. Although it depends on the shape of the local etching nozzle including a plasma electrode, as another manufacturing method of a light-condensing curved surface, it is also possible to produce a concave mirror shape by slanting the Si substrate and applying the etching beam as shown in FIG. 11. For example, as shown in (a) of FIG. 11, etching is performed for a given period without moving the Si substrate, the etching is temporarily stopped at the time when the etching deepest portion substantially reaches the optical waveguide upper end, and the Si substrate is slanted a predetermined angle (e.g., 45°).

After the Si substrate is slanted, as shown in (b) of FIG. 11, the Si substrate is finely adjusted such that the central line of the nozzle opening corresponds to a position on the end surface forming the reflective surface through which passes an extension of the central line of the optical waveguide core, and the irradiation of the etching beam is resumed. The etching is finished at the time when the etching deepest portion in the center of the nozzle opening reaches the extension of the central line of the optical waveguide core. In the above process, the slanted end surface is hollowed out and formed into a concave mirror shape such that the center of the concave mirror corresponds to the center of the outgoing light from the optical waveguide. Incidentally, the local etching nozzle may be slanted instead of slanting the Si substrate.

In the case of a PLC type optical device having a plurality of optical waveguides as shown in (b) of FIG. 6 of Example 1, a concave mirror shape can be additionally formed after a planar slanted end surface extending in a direction (Y axis direction) orthogonal to the optical waveguides is formed on the optical waveguide formation surface by a vertical rectangular nozzle. The concave mirror shape is formed by replacing the nozzle at the position corresponding to the optical waveguide forming the concave mirror shape with a nozzle having a circular opening and performing the aforementioned etching in the subsequent process by slanting the Si substrate. In this case, if etching is performed multiple times while moving the Si substrate by an interval between the optical waveguides in a direction in which the slanted end surface extends (Y axis direction), it is also possible to form a plurality of concave mirror shapes corresponding to the respective optical waveguides.

Figure 12:
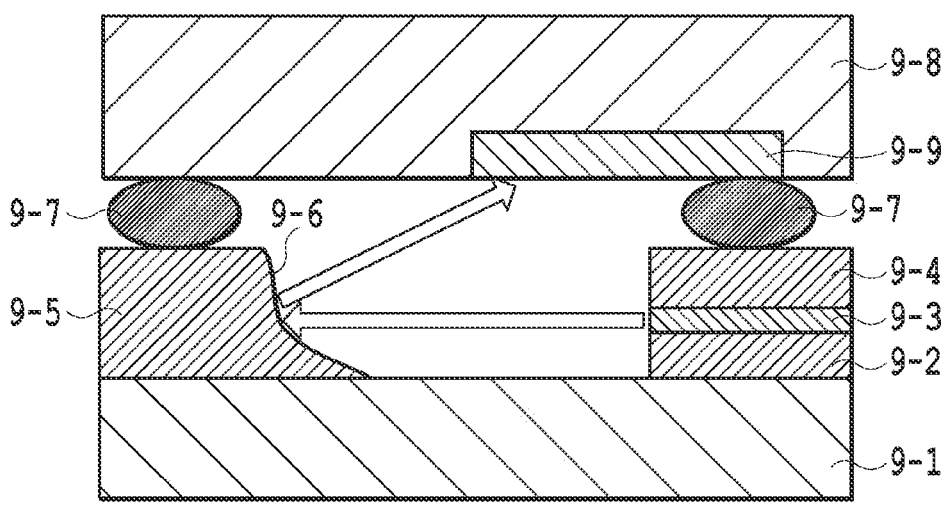

Mounting Structure in which the PLC of Example 2 and an Si Photonics Circuit are Coupled FIG. 12 is a cross-sectional view of a mounting structure in which the PLC of Example 2 and an Si photonics circuit are coupled. In Example 2, a mounting structure in which a PLC type optical circuit having a light-condensing nonplanar end surface formed thereon and an Si photonics circuit 9-8 are connected in the vertical direction was produced.

On the optical waveguide side of the PLC of FIG. 12, there are a laminated structure including an Si substrate 9-1, a lower cladding layer 9-2, a core 9-3, and an upper cladding layer 9-4 and a cladding layer 9-5 on a side forming a light-condensing end surface 9-6 to form a PLC type optical circuit.

The light-condensing end surface 9-6 produced in the PLC is formed on the side of the end surface of the cladding layer 9-5 corresponding to the extension of the core 9-3. The Si photonics circuit 9-8 is fixed on the PLC by two fixing bumps 9-7 above the PLC.

The optical connection is made via a grating coupler 9-9 provided in the surface of the Si photonics circuit 9-8 on the PLC side. For example, outgoing light from the core 9-3 of the optical waveguide on the right side of the PLC enters the light-condensing end surface 9-6, is reflected, converges, and enters the grating coupler 9-9 from the slanting lower left direction. Like Example 1, optical coupling in the opposite direction is also possible in the present example. The connection loss of optical coupling in this mounting structure is a little less than 2 dB. High-efficiency optical connection was realized by the light-condensing end surface and the effectiveness of the present invention was confirmed.

Example 3

Figure 13:
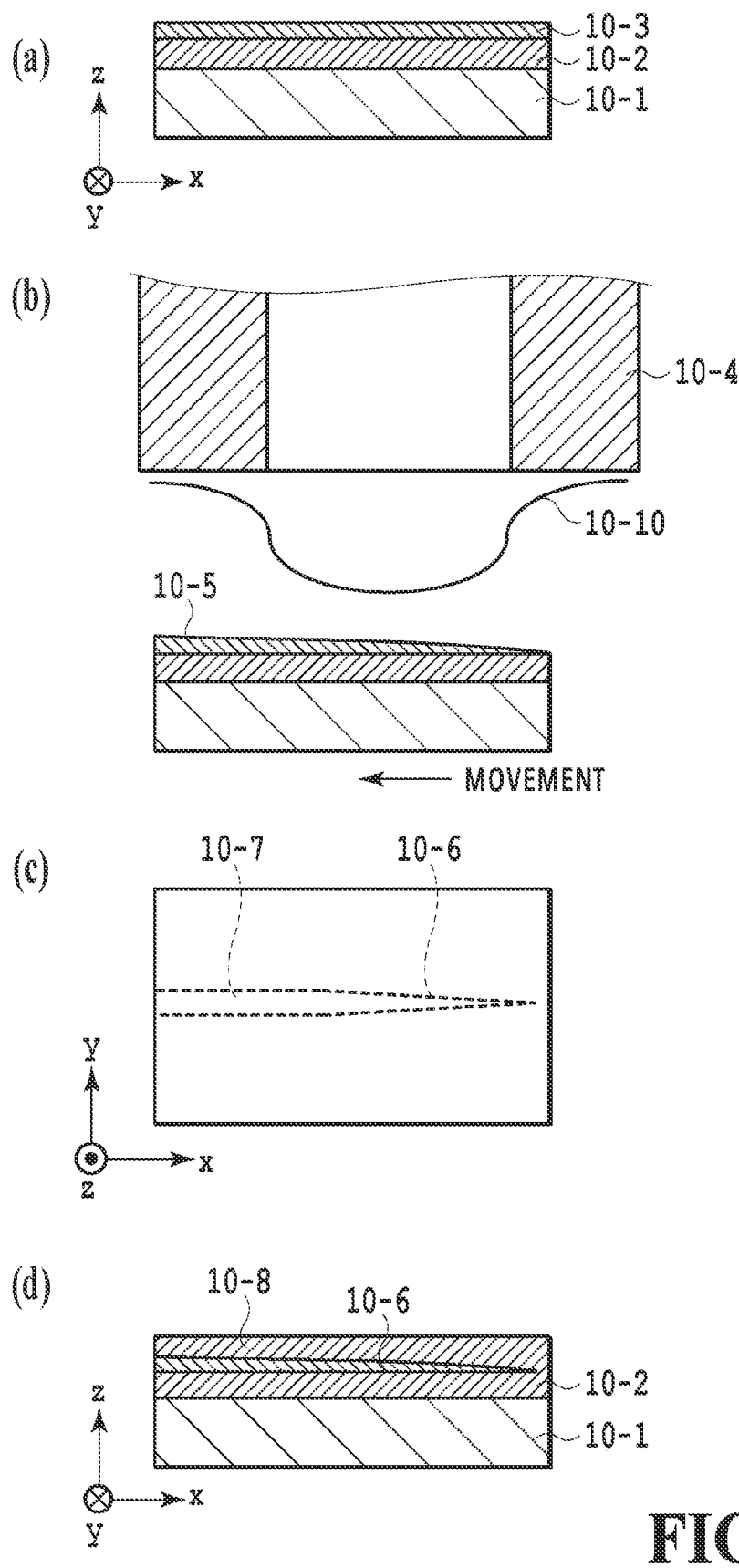

FIG. 13 is a process diagram illustrating an SSC manufacturing process in a PLC type optical device of Example 3 of the present invention. In Example 3, in an InP-based optical device as an example of an optical semiconductor, a film thickness controlled core having a core film thickness gradually decreasing in a tapered manner was formed by local etching. By this, a high-efficiency SSC (spot size converter) was produced and optical coupling with a single mode optical fiber as a different kind of waveguide was realized with a small loss.

In a substrate cross-sectional view (X-Z plane) of (a) of FIG. 13, an InP-based lower cladding layer 10-2 and an InP-based core layer 10-3 are stacked on an InP substrate 10-1.

As shown in (b) of FIG. 13, the substrate was irradiated with an etching beam 10-10 by 10-4 in a vacuum and local etching processing was performed. At that time, the amount of etching was changed by moving the InP substrate 10-1 in the horizontal direction (the negative direction of the X axis in which the optical waveguide extends) and the core layer was formed so as to gradually become thin. At the tip (right end) of the core layer, the thickness of the core layer was about zero and a tapered structure (film thickness controlled core 10-5) in the thickness direction was produced. The length of the tapered portion was about 50 m.

Specifically, $SiCl_4$ was used as a reactive etching gas, a pressure was 5 Pa, and the moving speed of the substrate in the X axis direction was controlled such that a core thickness of 0.5 m became zero at a moving distance of 50 m of the substrate.

In the case of moving the InP substrate 10-1 in an arrow direction in (b) of FIG. 13, the moving speed is gradually reduced and the amount of etching processing is increased. In the case of moving the InP substrate 10-1 in the opposite direction and producing a tapered shape, it is only necessary to gradually increase the moving speed of the substrate. Incidentally, it is also possible to finely adjust the amount of etching by moving the InP substrate 10-1 in the X axis direction (including reciprocation) after separating the position of the local etching nozzle or reducing the pressure of the etching gas.

Next, as shown in the substrate top view (X-Y plane) of (c) of FIG. 13, etching processing of the core layer was performed and an SSC portion 10-6 was formed on the right side of a core 10-7 such that the shape of the core layer on the substrate plane was also a tapered shape with a tapered tip (right end).

After that, as shown in the substrate cross-sectional view (X-Z plane) of (d) of FIG. 13, an upper cladding 10-8 was formed to embed the core and complete an SSC (spot size converter).

The above method made it possible to configure an SSC with a mode field diameter increasing toward the right side (X axis positive direction) in the vertical direction (substrate thickness direction, Z axis direction) and the horizontal direction (Y axis direction).

In an optical wavelength of 1.55 m, as a result of evaluating a connection loss between an optical device having an SSC produced in Example 3 and a general single mode fiber, the connection loss was about 1 dB. Since the connection loss is about 5 dB in the absence of the SSC, a huge reduction in connection loss was achieved.

As described above, in Example 3, a high-efficiency SSC can be easily produced by the use of a tapered film thickness controlled core. In this manner, the present invention enables production of a film thickness controlled core having a tapered shape in the vertical direction (core thickness direction), which was difficult to produce in the conventional manufacturing process.

Although the InP-based optical device has been described as an example of an optical semiconductor, it may also be an GaAs or Si semiconductor-based optical device.

In addition, although examples of the glass ($SiO_2$) or optical semiconductor-based PLC type optical device have been shown in Examples 1 to 3 above, the same manufacturing method is also possible even in the case of a $LiNbO_3$-based optical device.

Example 4

In Example 4, a description will be given of an optical device manufacturing apparatus which performs the manufacturing methods of Examples 1 to 3 and enables formation of a slanted end surface and a film thickness controlled core in a PLC type optical device.

Figure 14:
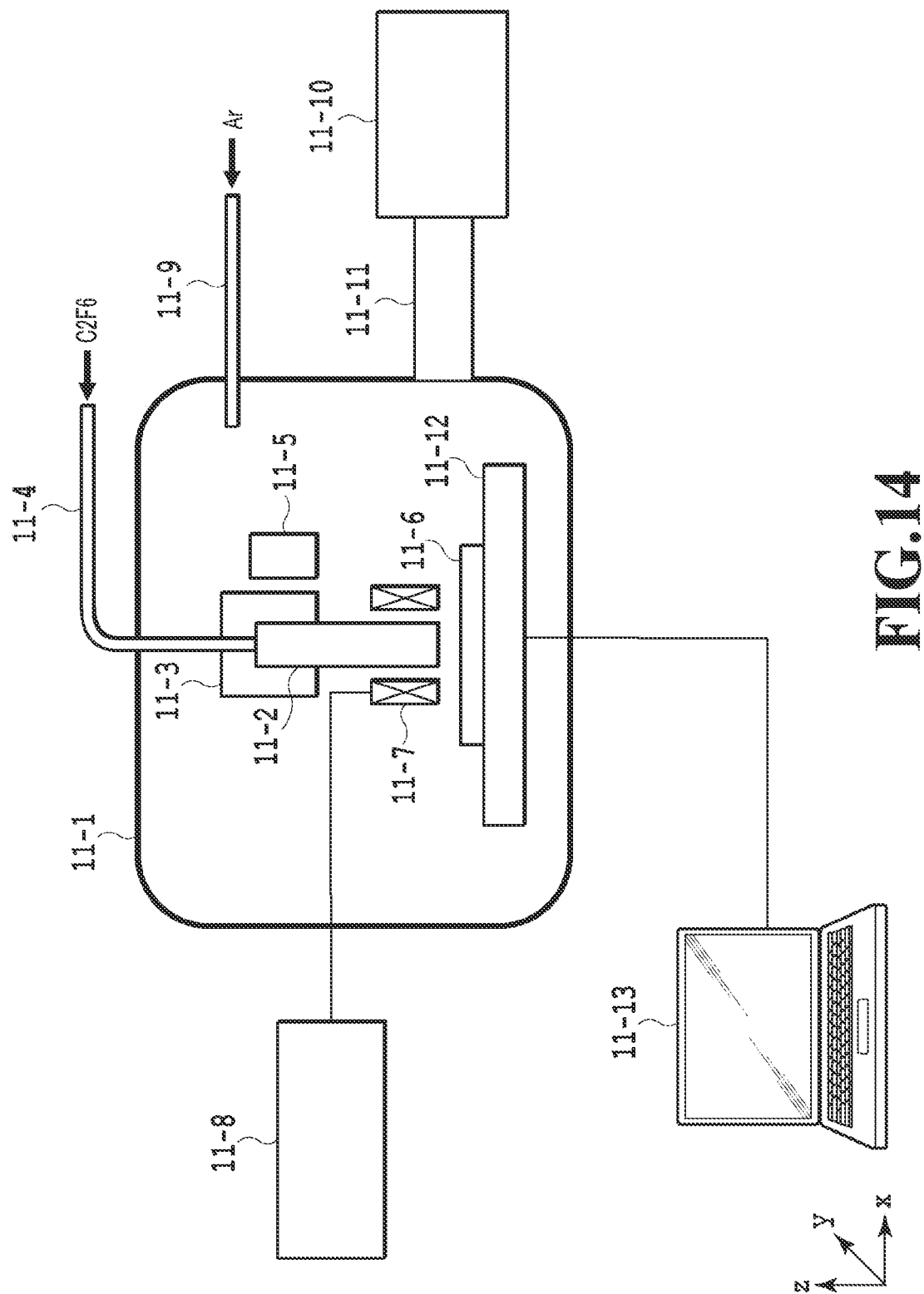

FIG. 14 is a configuration diagram of the manufacturing apparatus of Example 4 of the present invention. The optical device manufacturing apparatus of Example 4 is configured to adjust the relative positional relationship between a local etching nozzle 11-2 and a PLC wafer 11-6 placed on a moving stage 11-12 in the vertical direction (Z axis direction) and the horizontal direction (X, Y axis direction) and control an etching area and the shape of an end surface.

In a vacuum chamber 11-1 in the center of FIG. 14, a local etching nozzle 11-2 is held by a nozzle holding portion 11-3. An etching gas ($C_2F_6$) is suppled through an etching gas pipe 11-4.

The nozzle holding portion 11-3 also comprises a movable mechanism in the vertical direction (Z axis direction) and can adjust the height of the nozzle with respect to the moving stage 11-12. At this time, a laser displacement sensor 11-5 is used for adjustment to keep a constant interval between the opening portion at the nozzle tip and the PLC wafer 11-6.

A plasma electrode 11-7 is arranged near the nozzle 11-2 and supplied with RF power from an external plasma power source 11-8 to induce plasma in the vicinity of the nozzle tip and perform local etching.

The vacuum chamber 11-1 is equipped with an atmospheric gas pipe 11-9 and a vacuum pump 11-10 via an exhaust pipe 11-11 and adjusts the pressure in etching by controlling the flow rate of an atmospheric gas (Ar) from the atmospheric gas pipe 11-9.

In the case of forming a slanted end surface by local etching, the PLC wafer 11-6 is placed on the moving stage 11-12 and the amount of movement of the moving stage is adjusted by a control PC 11-13.

In the manufacturing apparatus of Example 4 shown in FIG. 14, the local etching nozzle was used to adjust the relative positional relationship with the PLC wafer in the vertical and horizontal directions, and slanted end surface processing, light-condensing end surface processing, and film thickness controlled core production were performed by the same manufacturing methods as Examples 1 to 3. As a result, a slanted end surface having high flatness, a light-condensing end surface, and a film thickness controlled core was formed in the PLC type optical device and the effectiveness of the present invention was confirmed.

INDUSTRIAL APPLICABILITY

The present invention can produce an optical device having an arbitrary slanted end surface, light-condensing end surface, or film thickness controlled core by application of the optical device manufacturing method and manufacturing apparatus using local etching as described in Examples and fulfill the need described above.

The invention claimed is:

1. An optical device manufacturing method using local etching, which includes a wafer process of manufacturing a waveguide type optical device composed of a light-propagating core and a cladding, the method comprising:
    forming a photoresist on a manufactured wafer;
    supplying a reactive etching gas to induce a local etching beam at the tip of a nozzle, the local etching beam having plasma with a Gaussian intensity distribution being rotationally symmetric about the central axis of the nozzle opening, the plasma including the reactive etching gas; and
    forming a slanted end surface at an arbitrary angle in an arbitrary position on the wafer by use of the nozzle by controlling a moving speed and relative positions between the wafer and the nozzle.

2. The optical device manufacturing method according to claim 1, the forming an end surface comprises forming a light-condensing shape on a wafer.

3. The optical device manufacturing method according to claim 1, the method comprising:
    forming a spot size converter (SSC) circuit by decreasing a thickness of a core in a tapered manner in an arbitrary position using the nozzle which locally performs etching processing.

4. The optical device manufacturing method according to claim 1, wherein
    the waveguide type optical device is an $SiO_2$-based planar lightwave circuit (PLC) type optical device, an optical semiconductor (InP, GaAs, Si)-based optical device, or a $LiNbO_3$-based optical device.

5. The optical device manufacturing method according to claim 2, wherein
    the waveguide type optical device is an SiO2-based planar lightwave circuit (PLC) type optical device, an optical semiconductor (InP, GaAs, Si)-based optical device, or a LiNbO3-based optical device.

6. The optical device manufacturing method according to claim 3, wherein
    the waveguide type optical device is an SiO2-based planar lightwave circuit (PLC) type optical device, an optical semiconductor (InP, GaAs, Si)-based optical device, or a LiNbO3-based optical device.

* * * * *